(12) United States Patent
Matsumoto et al.

(10) Patent No.: US 10,297,978 B2
(45) Date of Patent: May 21, 2019

(54) SEMICONDUCTOR OPTICAL DEVICE, SEMICONDUCTOR LIGHT SOURCE, AND OPTICAL INTEGRATED CIRCUIT

(71) Applicant: NATIONAL INSTITUTE OF INFORMATION AND COMMUNICATIONS TECHNOLOGY, Koganei-shi, Tokyo (JP)

(72) Inventors: Atsushi Matsumoto, Tokyo (JP); Kouichi Akahane, Tokyo (JP); Naokatsu Yamamoto, Tokyo (JP)

(73) Assignee: NATIONAL INSTITUTE OF INFORMATION AND COMMUNICATIONS TECHNOLOGY, Tokyo (JP)

( * ) Notice: Subject to any disclaimer, the term of this patent is extended or adjusted under 35 U.S.C. 154(b) by 0 days.

(21) Appl. No.: 16/008,261

(22) Filed: Jun. 14, 2018

(65) Prior Publication Data

US 2018/0375291 A1    Dec. 27, 2018

(30) Foreign Application Priority Data

Jun. 21, 2017 (JP) ................. 2017-121137

(51) Int. Cl.
*H01S 5/22* (2006.01)
*H01S 5/34* (2006.01)
(Continued)

(52) U.S. Cl.
CPC ............ *H01S 5/341* (2013.01); *H01S 5/0206* (2013.01); *H01S 5/2226* (2013.01); *H01S 5/343* (2013.01);
(Continued)

(58) Field of Classification Search
CPC ........ H01S 5/341; H01S 5/2226; H01S 5/343; H01S 5/0206; H01S 5/34353; H01S 5/0425
See application file for complete search history.

(56) References Cited

U.S. PATENT DOCUMENTS 6,150,672 A * 11/2000 Kaneko ................. H01L 33/325
257/22
2004/0104399 A1* 6/2004 Ou ........................ H01L 33/025
257/102
(Continued)

FOREIGN PATENT DOCUMENTS

JP    2007165798 A    6/2007

OTHER PUBLICATIONS

OKI Technical Review No. 211, 2007, vol. 74, No. 3, pp. 82-85.
(Continued)

*Primary Examiner* — Yuanda Zhang
(74) *Attorney, Agent, or Firm* — Holtz, Holtz & Volek PC

(57) ABSTRACT

A semiconductor optical device 1 includes an active layer 4 provided on a substrate 2, a clad layer 5 provided on the active layer 4, and a contact layer 7 provided on the clad layer 5. The contact layer 7 contains a first impurity and a second impurity different from the first impurity. A semiconductor light source includes the active layer 4 provided on the substrate 2, the clad layer 5 provided on the active layer 4, and the contact layer 7 provided on the clad layer 5. The contact layer 7 contains the first impurity and the second impurity different from the first impurity.

3 Claims, 6 Drawing Sheets

(51) Int. Cl.
  *H01S 5/02*  (2006.01)
  *H01S 5/343*  (2006.01)
  *H01S 5/042*  (2006.01)

(52) U.S. Cl.
  CPC ........ *H01S 5/34353* (2013.01); *H01S 5/0425* (2013.01)

(56) References Cited

U.S. PATENT DOCUMENTS

2007/0047068 A1\* 3/2007 Tanaka .................. B82Y 20/00
  359/344
2007/0153856 A1   7/2007 Kageyama et al.
2008/0227233 A1\* 9/2008 Hanamaki ............ H01S 5/0421
  438/45

OTHER PUBLICATIONS

Z. Mi, et al., "Room-temperature self-organised In0.5Ga0.5As quantum dot laser on silicon" Electronics letters, Jun. 23, 2005, vol. 41, No. 13, 2 Pages.

\* cited by examiner

US 10,297,978 B2

SEMICONDUCTOR OPTICAL DEVICE, SEMICONDUCTOR LIGHT SOURCE, AND OPTICAL INTEGRATED CIRCUIT

CROSS-REFERENCE TO RELATED APPLICATIONS

This application is based upon and claims the benefit of priority from prior Japanese Patent Application No. 2017-121137, filed Jun. 21, 2017, the entire contents of which are incorporated herein by reference.

FIELD

The present invention relates to a semiconductor optical device, a semiconductor light source, and an optical integrated circuit.

BACKGROUND

Recently, in association with a spread of mobile terminals such as smart phones and tablet terminals, high-speed mobile communications and a diversification of services for various mobile terminals have advanced, and a required communication capacity has been significantly increasing. While a network cloud service using big data has been gradually spreading in a network system, technologies such as a Machine to Machine (M2M) technology, which shares information between industrial machines, an Internet of Things (IoT) technology, which efficiently operates all apparatuses such as industrial equipment/devices and sensors via the Internet, and an edge computing technology, which executes information processing of IoT devices with an edge router in real-time (instantly), have been gathering the attention as considerably important technologies in the industry.

A further high speed and large capacity are indispensable for optical/wireless communications in an access network and a short range communication network at a data center to establish and develop such technologies. From such aspects, studies on the short range communications in the data center and between the data centers, an optical interconnection of an access system network, and a high communication speed and a large capacity in the optical/wireless communications have been carrying out worldwide. High-speed, large-capacity communications technology using Information and Communication Technology (ICT) hardware meeting requests such as low power consumption, low latency performance of a traffic, and a size and a cost of a communication device achieving such specifications are considered to be indispensable.

A study especially gathering the attention in the above-described field includes a study on a semiconductor optical device using Si photonics and the like and a study on an optical integrated circuit integrating a laser and the like using the above-described semiconductor optical device. The above-described studies on the semiconductor optical device and the like have high mutual compatibility with a Complementary metal oxide semiconductor (CMOS) line, which is used for a micro wiring of an LSI, and are considered to be significantly efficient and allow a low cost. Additionally, since the semiconductor optical device and the like ensure integration with the LSI, the semiconductor optical device and the like are recognized as a worldwide important topic of study in terms of achieving an optical integrated circuit that merges electrical/optical communications and allowing microminiaturization and low power consumption.

However, in the case where the above-described semiconductor optical device is mounted to a part of an integrated circuit in the LSI, a large heat caused by the LSI possibly becomes a problem. Since a temperature of a board around the LSI reaches around 80° C. by the heat generation in the LSI, properties of the semiconductor optical device are possibly deteriorated. Therefore, there is an object to achieve a semiconductor optical device that stably behaves and provides high performance even under a high temperature environment.

In contrast to this, for example, Patent Document 1 discloses a technology regarding a semiconductor laser device that can lower a threshold current especially at near a room temperature. Besides, for example, Non-Patent Document 1 discloses a technology that dopes (injects) p-type impurities into a part near an active layer and forms a light emitting element such as a semiconductor laser using a wafer with a structure in which a crystal is grown to improve a temperature property. For example, Non-Patent Document 2 discloses a technology regarding a method that forcibly cools heat generated from a light emitting element such as a semiconductor laser and other optical integrated circuits by a Thermo-Electric Cooler (TEC) such as a Peltier element.

The semiconductor laser disclosed in Patent Document 1 includes an active layer that includes a plurality of quantum-well layers and formed by arranging the quantum well layers and barrier layers alternatively. Among the barrier layers in the active layer, an amount of band discontinuity on a conduction band side between the barrier layer that is interposed by the quantum-well layers and the quantum-well layers is set to 26 meV or more and less than 300 meV, so that an overflow of carriers due to a thermal excitation between the quantum-well layers is intentionally caused to make a carrier density uniform between the quantum-well layers.

SUMMARY

However, while a semiconductor light source such as a semiconductor laser by the above-described related arts considerably improves a value of a characteristic temperature $T_0$, an index indicative of a temperature property, at near a room temperature, the semiconductor light source tends to be an insufficient improvement at high temperatures, making it difficult to reduce an increase in a threshold current at high temperatures. In view of this, a semiconductor optical device and the like that stably behave and provide high performance even under a high temperature environment have been desired to be achieved.

Therefore, the present invention has been devised in consideration of the above-described problems and its object is to provide a semiconductor optical device, a semiconductor light source, and an optical integrated circuit that stably behave and provide high performance even under a high temperature environment.

To solve the above-described problems, the inventors of the present invention have invented a semiconductor optical device, a semiconductor light source, and an optical integrated circuit that includes the semiconductor optical device. The semiconductor optical device and the semiconductor light source include an active layer, a clad layer, and a contact layer. The active layer is provided on a substrate. The clad layer is provided on the active layer. The contact layer is provided on the clad layer. The contact layer contains a first impurity and a second impurity different from the first impurity.

A semiconductor optical device according to a first aspect of the invention is a semiconductor optical device that includes an active layer, a clad layer, and a contact layer. The active layer is provided on a substrate. The clad layer is provided on the active layer. The contact layer is provided on the clad layer. The contact layer contains a first impurity and a second impurity different from the first impurity.

A semiconductor optical device according to a second aspect of the invention is configured as follows, in addition to the configuration of the first aspect. The first impurity is a beryllium or a zinc. The second impurity is an argon, a phosphorus, or a boron. The second impurity has a concentration of $1.0 \times 10^{12}$ cm$^{-2}$ or more to $1.0 \times 10^{15}$ cm$^{-2}$ or less.

A semiconductor light source according to a third aspect of the invention is a semiconductor light source that includes an active layer, a clad layer, and a contact layer. The active layer is provided on a substrate. The clad layer is provided on the active layer. The contact layer is provided on the clad layer. The contact layer contains a first impurity and a second impurity different from the first impurity.

An optical integrated circuit according to a fourth aspect of the invention is an optical integrated circuit that includes a semiconductor optical device including an active layer, a clad layer, and a contact layer. The active layer is provided on a substrate. The clad layer is provided on the active layer. The contact layer is provided on the clad layer. The contact layer contains a first impurity and a second impurity different from the first impurity.

DETAILED DESCRIPTION (Semiconductor Optical Device 1)

Figure 1A:
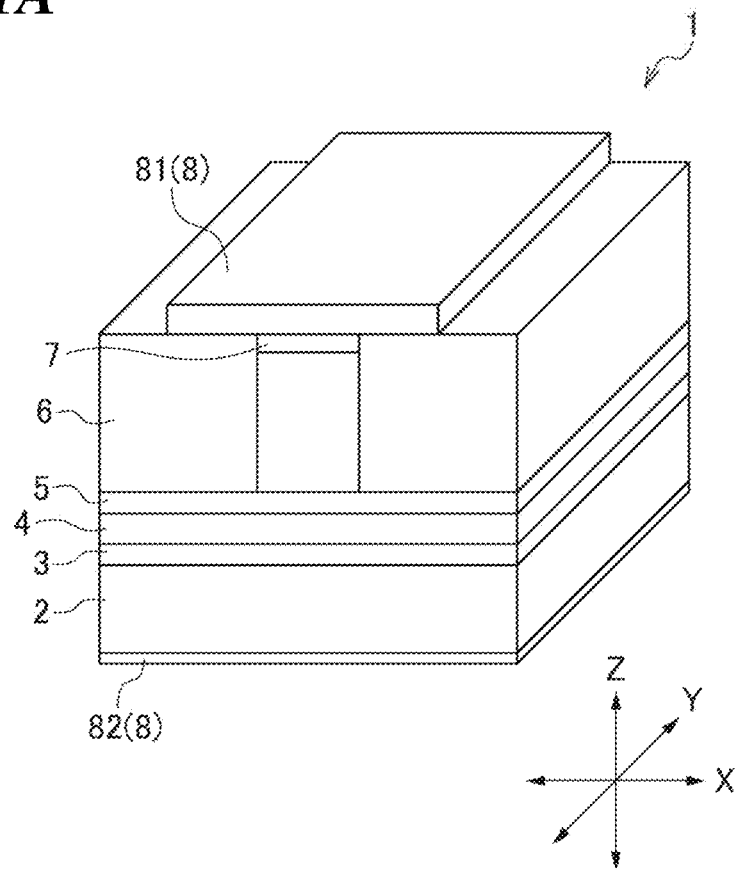
FIG. 1A is a schematic perspective view illustrating one example of a semiconductor optical device according to an embodiment.
Figure 1B:
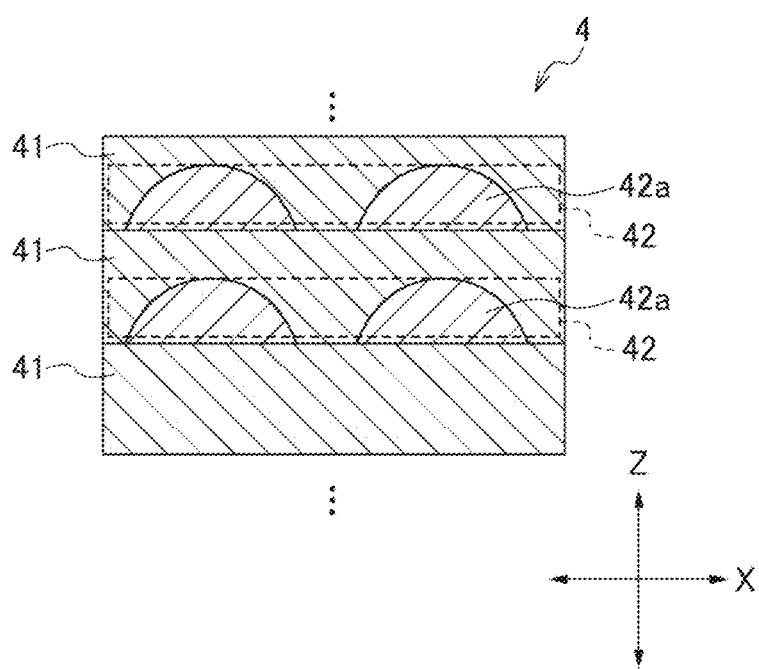
FIG. 1B is an enlarged schematic cross-sectional view illustrating one example of an active layer.

The following describes a semiconductor optical device 1 according to the embodiment of the present invention. FIG. 1A is a schematic perspective view illustrating one example of the semiconductor optical device 1 according to the embodiment, and FIG. 1B is an enlarged schematic cross-sectional view illustrating one example of an active layer 4. Note that directions parallel to a principal surface of a substrate 2 in each drawing are defined as an X-direction and a Y-direction, and a direction intersecting with the X-direction and the Y-direction is defined as a Z-direction.

As illustrated in FIG. 1A, the semiconductor optical device 1 includes the substrate 2, the active layer 4, a clad layer 5, and a contact layer 7. The semiconductor optical device 1, for example, may include a lower-layer clad layer 3, insulating layers 6, and an electrode 8.

The semiconductor optical device 1 is mainly used as a configuration of a semiconductor light source such as a semiconductor laser and a Semiconductor Optical Amplifier (SOA). In addition to the semiconductor light source, the semiconductor optical device 1 is used as a configuration of, for example, a photodiode and a semiconductor light receiving element, and, for example, is used as a configuration of an optical integrated circuit including an LSI.

<Substrate 2>

The substrate 2 contains n-type impurities and contains, for example, P (phosphorus), S (sulfur), or As (arsenic). As the substrate 2, for example, InP(001), GaAs (gallium arsenide), or Si (silicon) is used in addition to the use of, for example, InP(311) B.

<Lower-Layer Clad Layer 3>

The lower-layer clad layer 3 is, for example, provided on the substrate 2. The lower-layer clad layer 3 contains n-type impurities and contains, for example, P, S, As, or Si. As the lower-layer clad layer 3, for example, InP, InGaAsP, or AlGaAs is used in addition to, for example, the use of InAlAs. Since any given composition ratio is employed for each material, the composition ratios are omitted, and the same applies to the following description.

<Active Layer 4>

The active layer 4 is provided on the substrate 2, and, for example, the lower-layer clad layer 3 is interposed between the active layer 4 and the substrate 2. As illustrated in FIG. 1B, the active layer 4 includes a plurality of barrier layers 41 and a plurality of quantum layers 42 laminated in alternation. As the respective quantum layers 42, for example, a plurality of quantum dots 42a having a quantum dot structure may be used. In this case, the barrier layers 41 may be provided at clearances between the respective quantum dots 42a. As the respective quantum layers 42, for example, quantum well layers having a quantum well structure or quantum wire layers having a quantum wire structure may be used. The numbers of laminations of the barrier layer 41 and the quantum layer 42 are any given number.

As the barrier layer 41, for example, InGaAsP, GaAs, GaNAs, GaNAsP, GaInAs, GaInNAs, GaInAsSb, GaInNAsSb, or GaNAsSb may be used in addition to the use of, for example, InGaAlAs. As the quantum layer 42 or the quantum dot 42a, for example, GaInNAsSb, GaInAsSb, or GaInAs may be used in addition to the use of, for example, InAs. At least any of the barrier layer 41 and the quantum layer 42 may contain, for example, impurities.

The barrier layer 41 has a thickness of, for example, 5 nm or more to 20 nm or less. The quantum layer 42 has a thickness of, for example, 1 nm or more to 20 nm or less. Here, "thickness" means a thickness in the Z-direction, and the same applies to the following description.

<Clad Layer 5>

The clad layer 5 is provided on the active layer 4. The clad layer 5 may be formed into, for example, a mesa shape, may include a planar portion expanding on the X-Y plane and a projecting portion extending from the planar portion in the Z-direction, and the projecting portion may be interposed between the insulating layers 6.

The clad layer 5 contains p-type impurities and contains, for example, B (boron), Zn (zinc), Be (beryllium), Mg (magnesium), or Cd (cadmium). As the clad layer 5, for example, InP or AlGaAs is used in addition to the use of, for example, InAlAs.

<Contact Layer 7>

The contact layer 7 is provided on the clad layer 5. The contact layer 7 is, for example, provided on a protrusion of the clad layer 5 and interposed between the insulating layers 6. The contact layer 7 has a thickness thinner than the thickness of the clad layer 5.

The contact layer 7 contains a first impurity and a second impurity. The first impurity may be, for example, Zn, Mg, or Cd in addition to Be of the p-type impurities. The second impurity is, for example, Ar (Argon) of the p-type impurity. Any of the first impurity and the second impurity may be, for example, B. The second impurity may be, for example, P of n-type impurities.

The second impurity has a concentration of $1.0 \times 10^{12}$ cm$^{-2}$ or more to $1.0 \times 10^{15}$ cm$^{-2}$ or less and preferably $1.0 \times 10^{13}$ cm$^{-2}$ or more to $5.0 \times 10^{14}$ cm$^{-2}$ or less. As the contact layer 7, for example, GaAs may be used in addition to the use of InGaAs. In the case where the second impurity is the p-type impurity, the p-type impurity contained in the contact layer 7 have the concentration higher than the concentration of the p-type impurities contained in the clad layer 5.

<Electrode 8>

The electrode 8 includes an upper layer electrode 81 in contact with the contact layer 7 and a lower layer electrode 82 in contact with the substrate 2. The electrode 8 is used to apply a voltage to the active layer 4. As the respective electrodes 81 and 82, for example, a laminated body of Ti, Pt, and Au is used.

<Insulating Layer 6>

The insulating layers 6 may be, for example, provided on the contact layer 7 in addition to being provided on the clad layer 5. The insulating layers 6 are provided by interposing at least any of the clad layer 5, the contact layer 7, and the upper layer electrode 81. As the insulating layer 6, for example, benzocyclobutene (BCB) or silicon oxide (SiO$_2$) is used.

With the semiconductor optical device 1 according to the embodiment, the contact layer 7 contains the first impurity and the second impurity. At this time, for example, the active layer 4 exhibits a mixed crystal state at parts near boundaries between the barrier layers 41 and the quantum layers 42 and increases the resistance. This ensures the stable behavior and high performance even under a high temperature environment.

With the semiconductor optical device 1 according to the embodiment, for example, the clad layer 5 may contain the second impurity in addition to the contact layer 7. In this case, the concentration of the second impurity contained in the clad layer 5 lowers from the side in contact with the contact layer 7 to the side in contact with the active layer 4. The second impurity is not contained in the active layer 4 or is contained at a concentration lower than that of the clad layer 5. This ensures reducing a decrease in a light emission property of the active layer 4 in association with a diffusion of the second impurity. This allows the stable behavior and facilitating high performance even under a high temperature environment.

(Semiconductor Light Source, Optical Integrated Circuit 30)

Figure 2A:
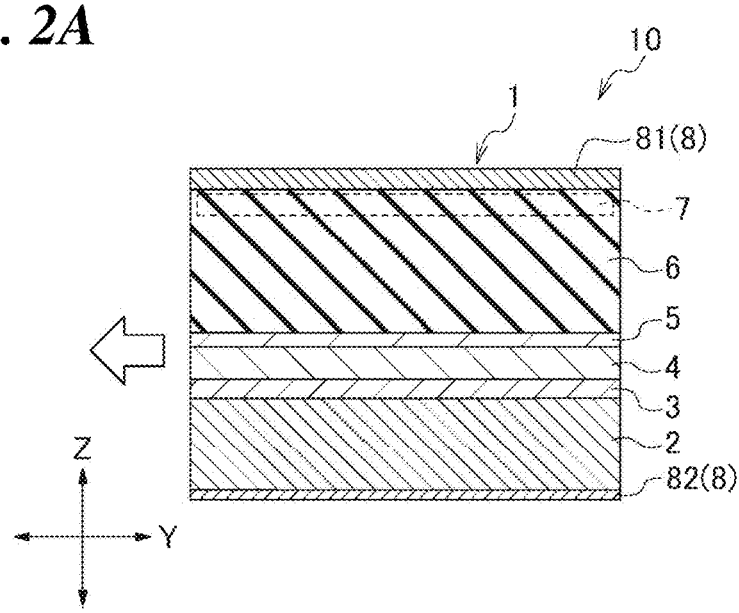
FIG. 2A is a schematic cross-sectional view illustrating one example of a semiconductor laser according to the embodiment.
Figure 2B:
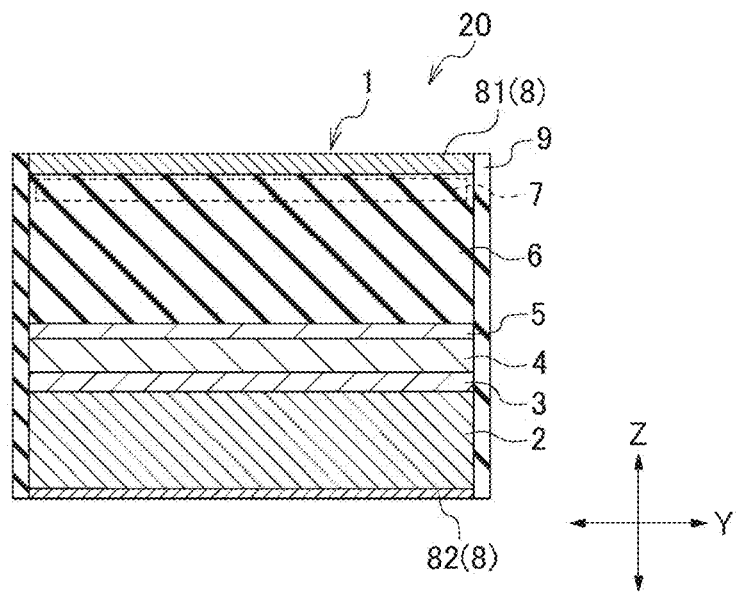
FIG. 2B is a schematic cross-sectional view illustrating one example of a semiconductor optical amplifier according to the embodiment.
Figure 2C:
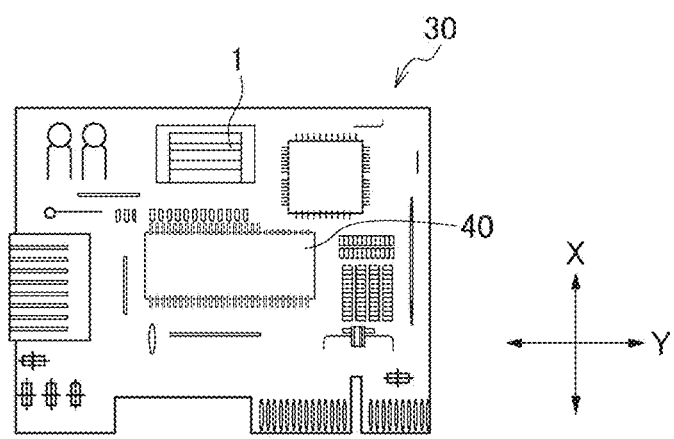
FIG. 2C is a schematic plan view illustrating one example of an optical integrated circuit according to the embodiment.

Next, the following describes a semiconductor light source (for example, a semiconductor laser 10 and a semiconductor optical amplifier 20) and the optical integrated circuit 30 according to the embodiment. The semiconductor light source and the optical integrated circuit 30 can include the semiconductor optical device 1. FIG. 2A is a schematic cross-sectional view illustrating one example of the semiconductor laser 10 according to the embodiment. FIG. 2B is a schematic cross-sectional view illustrating one example of the semiconductor optical amplifier 20 according to the embodiment. FIG. 2C is a schematic plan view illustrating one example of the optical integrated circuit 30 according to the embodiment.

<Semiconductor Laser 10>

For example, as illustrated in FIG. 2A, the semiconductor laser 10 includes the semiconductor optical device 1. For example, applying a voltage to the electrodes 81 and 82 causes the semiconductor laser 10 to emit a laser light in a predetermined wavelength band from the active layer 4 (the arrow direction in the drawing). For example, the semiconductor laser 10 may include a pair of reflection layers (not illustrated) between the substrate 2 and the contact layer 7. In this case, the laser light is emitted in the Z-direction.

The upper layer electrode 81 of the semiconductor laser 10, for example, has a stripe structure extending in the Y-direction. At this time, the upper layer electrode 81 has a length L of, for example, approximately 600 μm in the Y-direction and has a width W of approximately 50 μm in the X-direction.

<Semiconductor Optical Amplifier 20>

For example, as illustrated in FIG. 2B, the semiconductor optical amplifier 20 includes the semiconductor optical device 1. In this case, the semiconductor optical amplifier 20 includes anti-reflection films 9 on both side surfaces in the Y-direction. As the anti-reflection film 9, for example, a multilayer film made of silicon oxide and titanium oxide is used.

<Optical Integrated Circuit 30>

For example, as illustrated in FIG. 2C, the optical integrated circuit 30 includes the semiconductor optical device 1. In this case, the semiconductor optical device 1 is regulated by a control unit 40 provided with the optical integrated circuit 30. The semiconductor optical device 1 is, for example, used as a semiconductor light source that emits a laser light based on a signal transmitted from the control unit 40. Besides, the semiconductor optical device 1 may be used as, for example, a semiconductor light receiving element that transmits information on a light received from outside to the control unit 40.

With at least any of the semiconductor light source and the optical integrated circuit 30 according to the embodiment, including the semiconductor optical device 1 allows reducing an increase in a threshold current in association with a temperature rise from under a room temperature environment. This ensures the stable behavior and high performance even under a high temperature environment.

Additionally, with at least any of the semiconductor light source and the optical integrated circuit 30 according to the embodiment allows reducing an amount of peak shift of a wavelength of the emitted light in association with the temperature rise from under a room temperature environment. This ensures the stable behavior and high performance even under a high temperature environment.

Additionally, the optical integrated circuit 30 according to the embodiment can stably behave and provide the high performance even when a large heat is caused by the LSI. This allows microminiaturization and low power consumption and further allows achieving high-speed, large-capacity communications.

(Method for Manufacturing Semiconductor Optical Device 1)

Figure 3:
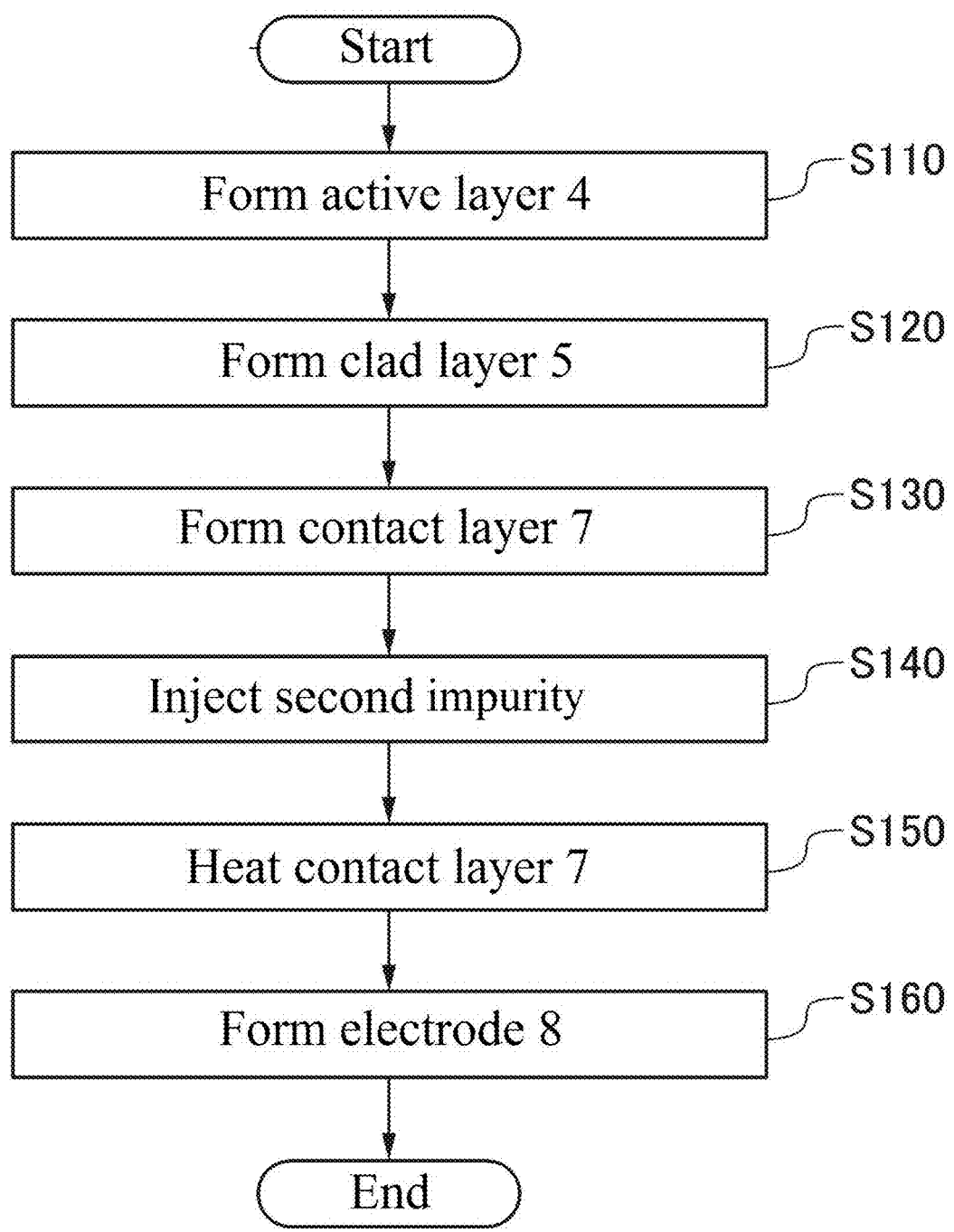
FIG. 3 is a flowchart illustrating one example of a method for manufacturing the semiconductor optical device according to the embodiment.

Next, the following describes one example of the method for manufacturing the semiconductor optical device 1 according to the embodiment. FIG. 3 is a flowchart illustrating one example of the method for manufacturing the semiconductor optical device 1 according to the embodiment.

<Form Active Layer 4: Step S110>

First, the active layer 4 is formed on the substrate 2 (Step S110). At this time, for example, a buffer layer (not illustrated) or a similar layer may be formed between the substrate 2 and the active layer 4, in addition to the lower-layer clad layer 3. As a method for forming the active layer 4, for example, a Metal Organic Chemical Vapor Deposition (MOCVD) method may be used in addition to the use of a Molecular Beam Epitaxy (MBE) method.

As the substrate 2, for example, an InP(311) B substrate containing P, S, or As of the n-type impurities is used, and as the lower-layer clad layer 3, for example, InAlAs containing P, Si, or As of the n-type impurities is used. The active layer 4 is formed by laminating the plurality of barrier layers 41 and quantum layers 42 in alternation. For example, InGaAlAs is used as the barrier layer 41, and InAs having a quantum dot structure is used as the quantum layer 42.

At this time, for example, the impurities are not injected into the barrier layers 41 and the quantum layers 42 in some cases. In this case, the impurities do not diffuse into the active layer 4 in association with a heating process described later. This allows reducing the decrease in the light emission property of the active layer 4.

<Form Clad Layer 5: Step S120>

Next, the clad layer 5 is formed on the active layer 4 (Step S120). As a method for forming the clad layer 5, for example, the MOCVD method may be used in addition to the use of the MBE method. The clad layer 5 is formed with a thickness, for example, around from 1.5 µm to 2 µm.

As the clad layer 5, for example, InAlAs containing Be of the p-type impurities is used. The clad layer 5, for example, may contain the second impurity described later.

<Form Contact Layer 7: Step S130>

Next, the contact layer 7 is formed on the clad layer 5 (Step S130). As a method for forming the contact layer 7, for example, the MOCVD method may be used in addition to the use of the MBE method. The contact layer 7 is formed with a thickness, for example, around 100 nm.

As the contact layer 7, for example, InGaAs containing Be of the first impurity is used. For example, after forming InGaAs, Be may be injected by a method such as an ion implantation method.

<Inject Second impurity: Step S140>

Next, the second impurity is injected into the contact layer 7 (Step S140). As a method for injecting the second impurity, for example, the ion implantation method is used.

As the second impurity, for example, Ar is used. A dose amount when the second impurity is injected is $1.0\times10^{12}$ $cm^{-2}$ or more to $1.0\times10^{15}$ $cm^{-2}$ or less.

For example, with the dose amount of the second impurity of $1.0\times10^{12}$ $cm^{-2}$ or less, since the concentration of the second impurity is low, the change in the threshold current in association with the injection of the impurities is less likely to be obtained. In view of this, the increase in the threshold current in association with the temperature rise from under the room temperature environment cannot be reduced. Additionally, for example, when the dose amount of the second impurity exceeds $1.0\times10^{15}$ $cm^{-2}$, a level of deterioration of crystalline of the contact layer 7 increases in association with the injection of the impurity, possibly resulting in a large resistance. In view of this, the increase in the threshold current in association with the temperature rise from under the room temperature environment cannot be reduced.

In view of this, according to this embodiment, designing the dose amount when the second impurity is injected to be $1.0\times10^{12}$ $cm^{-2}$ or more to $1.0\times10^{15}$ $cm^{-2}$ or less allows reducing the increase in the threshold current in association with the temperature rise from under the room temperature environment. Note that the dose amount when the second impurity is injected is preferably $1.0\times10^{13}$ $cm^{-2}$ or more to $5.0\times10^{14}$ $cm^{-2}$ or less. This allows further reducing the increase in the threshold current in association with the temperature rise from under the room temperature environment.

An accelerating voltage when the second impurity is injected is preferably 60 keV or more. With the accelerating voltage of less than 60 keV, the second impurity is less likely to be injected into the contact layer 7 and the change in the threshold current is less likely to be obtained. In view of this, the accelerating voltage when the second impurity is injected is preferably 60 keV or more, and 120 keV or more to 150 keV or less is more preferable.

<Heat Contact Layer 7: Step S150>

Next, the contact layer 7 is heated (Step S150). As a method for heating the contact layer 7, for example, a rapid thermal annealing (RTA) method is used. Note that when the contact layer 7 is heated, a configuration from the substrate 2 to the clad layer 5 is also heated.

The contact layer 7 is heated at a heating temperature of 600° C. or more to 720° C. or less and a heating period of 30 seconds or more to 180 seconds or less. Heating the contact layer 7 allows the second impurity to diffuse into the contact layer 7 and allows the crystalline of the contact layer 7 deteriorated in association with the injection of the second impurity to be repaired (recrystallized). Further, in association with the heating of the contact layer 7, a mixed crystal composition occurs in the active layer 4.

For example, with the heating temperature of less than 600° C. or the heating period of less than 30 seconds, the diffusion of the second impurity or the repair of the crystalline of the contact layer 7 becomes insufficient. In view of this, the formed semiconductor optical device 1 exhibits a trend of deteriorating the emission intensity. For example, with the heating temperature in excess of 720° C. or the heating period in excess of 180 seconds, there is a possibility of accelerating deterioration of another configuration of the active layer 4 or a similar layer. In view of this, the formed semiconductor optical device 1 exhibits a trend of deteriorating the emission intensity.

In view of this, according to this embodiment, heating the contact layer 7 with the heating temperature of 600° C. or more to 720° C. or less and the heating period of 30 seconds or more to 180 seconds or less allows keeping the satisfactory emission intensity in the formed semiconductor optical device 1. This allows maintaining the high performance even under a high temperature environment.

Note that heating the contact layer 7 with the heating temperature of 600° C. or more to 680° C. or less and the heating period of 45 seconds or more to 180 seconds or less is preferable. This allows forming the semiconductor optical device 1 with the high emission intensity.

<Form Electrode 8: Step S160>

Next, the electrode 8 is formed (Step S160). As a method for forming the electrode 8, for example, a vapor deposition method is used. The electrode 8 includes the upper layer electrode 81 formed on the contact layer 7 and the lower layer electrode 82 formed below the substrate 2. The formation of the electrode 8 after Step S150 ensures preventing the deterioration of the electrode 8. This allows reducing the deterioration of the property of the electrode 8.

A laminated body of, for example, Ti, Pt, and Au is used as the upper layer electrode 81 and the lower layer electrode 82. The Ti layer of the upper layer electrode 81 is, for example, formed so as to be in contact with the contact layer 7. The Ti layer of the lower layer electrode 82 is, for example, formed so as to be in contact with the substrate 2.

For example, before the formation of the electrode 8, the insulating layers 6 may be formed. As a method for forming the insulating layers 6, for example, a CVD method is used. As the insulating layer 6, benzocyclobutene or silicon oxide is used.

For example, to form the insulating layers 6 as illustrated in FIG. 1A, after the contact layer 7 is formed, a pattern is formed on the contact layer 7 by, for example, a photolithography method, and the contact layer 7 and the clad layer 5 are selectively removed by a method such as a Reactive Ion Etching (RIE) method. Afterwards, the insulating layers 6 are formed at parts from which the contact layer 7 and the clad layer 5 have been removed.

Figure 4:
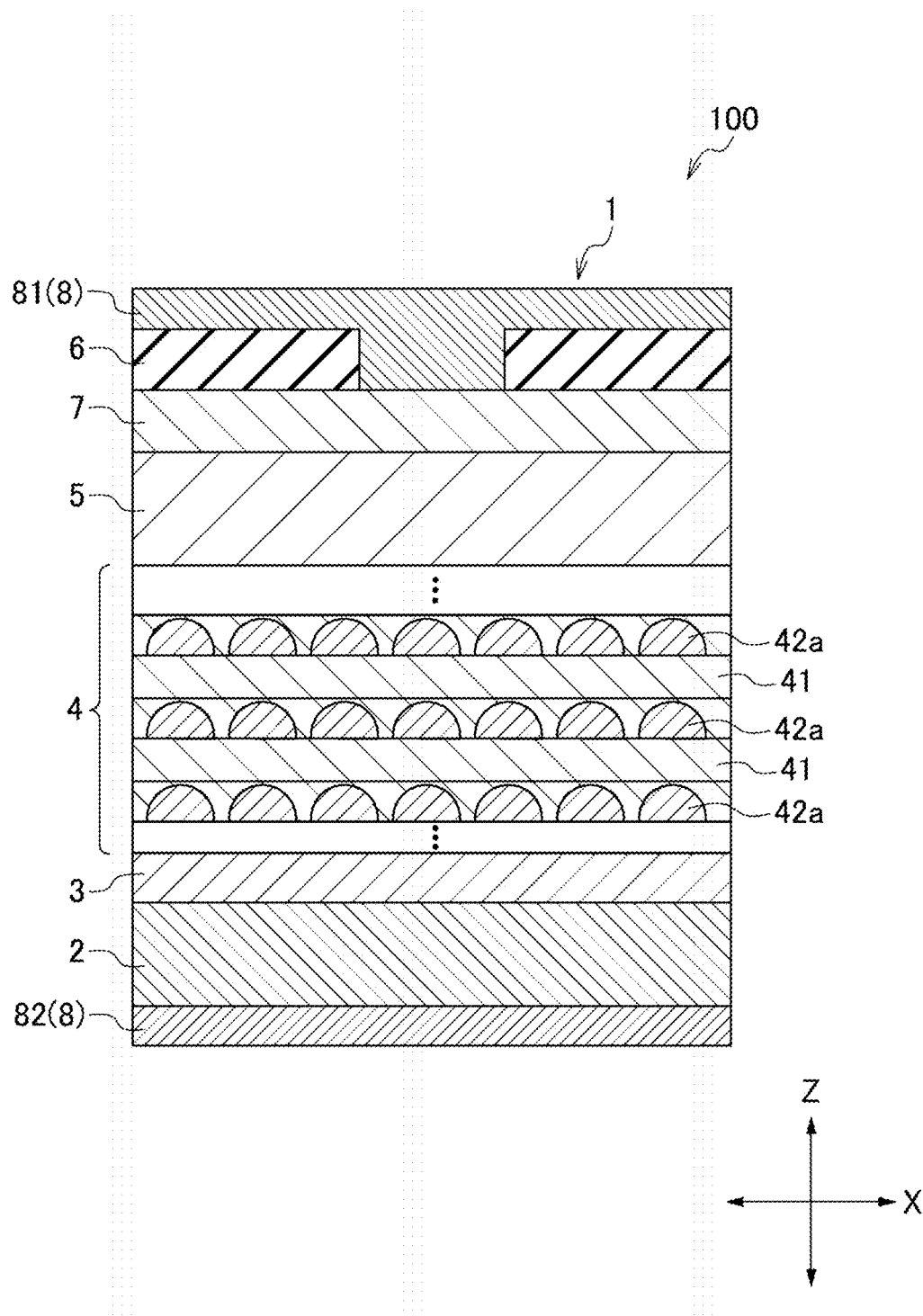
FIG. 4 is a schematic cross-sectional view of an evaluation sample created in Working Example 1.

In addition to the above-described case, for example, to form the insulating layers 6 as illustrated in FIG. 4, after the insulating layer 6 is formed on the contact layer 7, a pattern is formed on the insulating layer 6 by, for example, a photolithography method, and the insulating layer 6 is selectively removed by a method such as the RIE method. Afterwards, the upper layer electrode 81 is formed on the part from which the insulating layer 6 has been removed and on the insulating layers 6.

The semiconductor optical device 1 according to the embodiment is formed through the above-described respective processes (steps). The above-described respective processes are provided also in the case where the semiconductor light source and the optical integrated circuit 30 according to the embodiment are manufactured.

The method for manufacturing the semiconductor optical device 1 according to the embodiment injects the second impurity into the contact layer 7 containing the first impurity and heats the contact layer 7. The semiconductor optical device 1 formed through these processes exhibits a small change in the threshold current in association with the temperature change. In view of this, the increase in the threshold current in association with the temperature rise from under the room temperature environment can be reduced. This ensures the stable behavior and high performance even under a high temperature environment.

The method for manufacturing the semiconductor optical device 1 according to the embodiment can stay the range in which the second impurity injected into the contact layer 7 diffuses in association with the heating to the contact layer 7 and the clad layer 5, thereby ensuring reducing the diffusion of the second impurity into the active layer 4. This makes the reduction in deterioration of the light emission property of the active layer 4 possible.

WORKING EXAMPLE 1

Next, the following describes Working Example 1 of the semiconductor optical device 1 according to the embodiment. Working Example 1 created a semiconductor laser including the semiconductor optical device 1 as illustrated in FIG. 4 as an evaluation sample 100 for evaluation on properties.

Working Example 1 created the three evaluation samples 100 (Reference Example 1-1, Reference Example 1-2, and Working Example 1-1) whose conditions of whether Ar was injected into the contact layer 7 formed of InGaAs or not and whether the contact layer 7 was heated or not were changed. In the evaluation samples 100, the barrier layers 41 and the quantum layers 42 were formed by 30 layers in total as the active layer 4 and the quantum dot 42a was used as the quantum layer 42. The upper layer electrode 81 in contact with the contact layer 7 was formed so as to be interposed between the insulating layers 6 and have a width of 50 μm in the X-direction. The other main configurations are similar to the above-described semiconductor optical device 1 and therefore the description is omitted.

The evaluation method was to measure a threshold current density ($kA/cm^2$) of the evaluation samples 100 at respective set temperatures (288 K to 353 K), calculate a characteristic temperature $T_0$, and evaluate a temperature dependence of a threshold current. The characteristic temperature $T_0$ is an index indicative of the temperature property and was calculated by the known method. Generally, it can be evaluated that the larger the characteristic temperature $T_0$ value is, the smaller the temperature dependence of the threshold current is. Furthermore, a peak wavelength of a laser emitted from the evaluation samples 100 at the respective set temperatures (30° C., 50° C., 70° C.) was measured to evaluate the temperature dependence. Generally, it can be evaluated that the smaller an amount of shift of the peak wavelength in association with the temperature change, the smaller the temperature dependence of the semiconductor laser is.

TABLE 1

|  |  | Reference Example 1-1 | Reference Example 1-2 | Working Example 1-1 |
|---|---|---|---|---|
| Creation Condition | Temperature [° C.] | — | 680 | 680 |
|  | Period [sec] | — | 120 | 120 |
|  | Dose Amount [$cm^{-2}$] | — | — | $1.0 \times 10^{14}$ |
| Evaluation Result | Characteristic Temperature $T_0$ [K] (Target Temperature) | Ordinary Temperature Region | 118 (288 K to 323 K) | 201 (288 K to 313 K) | 134 (288 K to 303 K) |
|  |  | High Temperature Region | 64 (323 K to 353 K) | 77 (323 K to 353 K) | 575 (303 K to 353 K) |
|  | Peak Wavelength (30° C.) [nm] | 1528 | 1483 | 1412 |
|  | Amount of Peak Shift [nm/° C.] | 0.52 | 0.45 | 0.11 to 0.15 |

Figure 5:
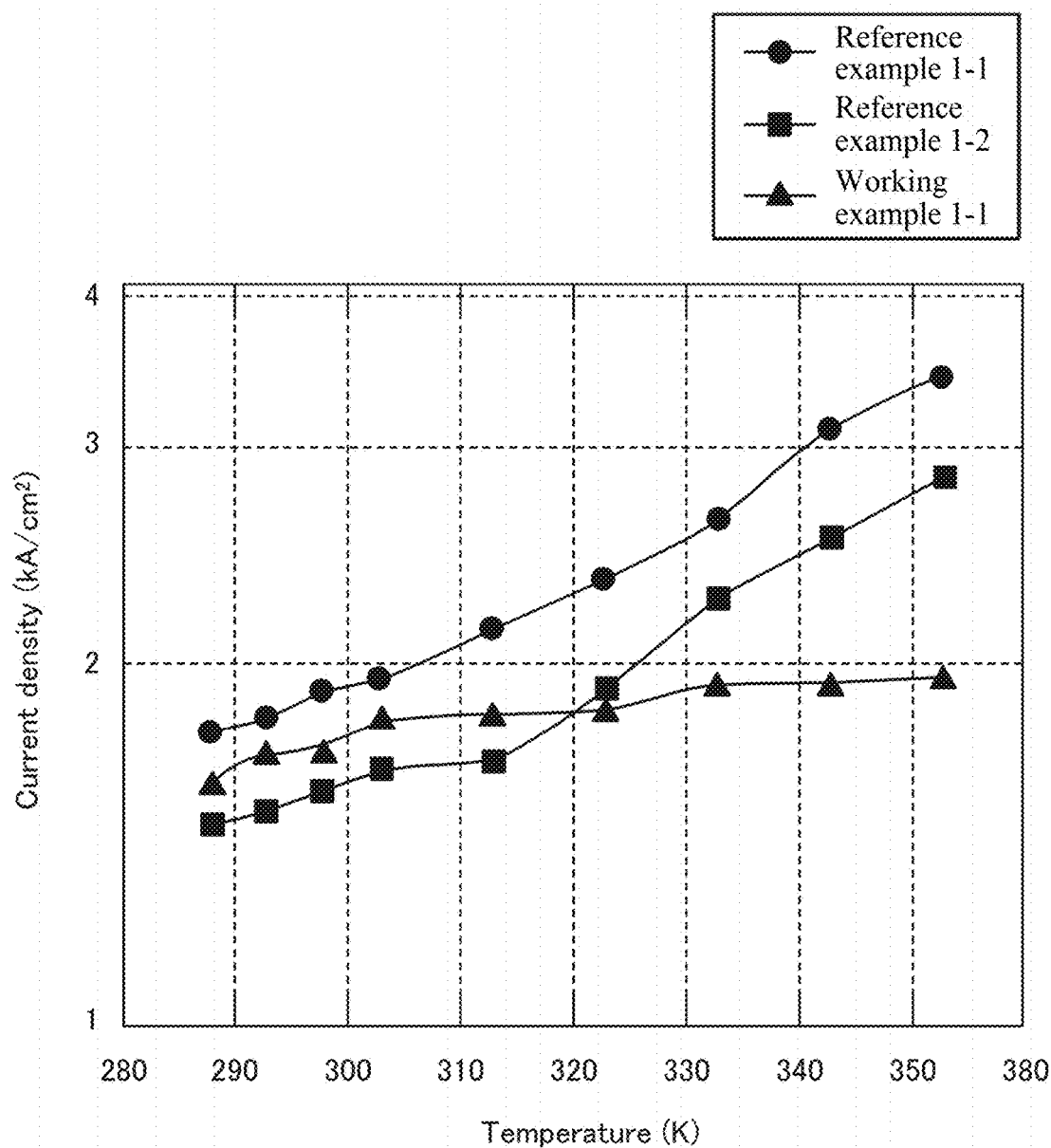
FIG. 5 is a graph illustrating results of measuring a threshold current density of respective evaluation samples at set temperatures.

Table 1 is a table showing creation conditions and evaluation results of the respective evaluation samples 100. FIG. 5 is a graph illustrating results of measuring the threshold current density of the respective evaluation samples 100 at the set temperatures. The horizontal axis indicates the temperature (Temperature (K)), and the vertical axis indicates the threshold current density (Current density ($kA/cm^2$)). The characteristic temperatures $T_0$ of Table 1 were calculated based on the measured values of the threshold current density illustrated in FIG. 5.

Reference Example 1-1 is an evaluation sample formed without an injection of Ar into the contact layer 7 and without heating of the contact layer 7. At this time, the characteristic temperature $T_0$ in an ordinary temperature region (288 K to 323 K) was 118 K, and the characteristic temperature $T_0$ in a high temperature region (323 K to 353 K) was 64. Reference Example 1-2 is a sample formed without the injection of Ar into the contact layer 7 and by heating the contact layer 7. At this time, the characteristic temperature $T_0$ in the ordinary temperature region (288 K to 313 K) was 201 K, and the characteristic temperature $T_0$ in the high temperature region (323 K to 353 K) was 77.

Working Example 1-1 is a sample formed by injecting Ar into the contact layer 7 and heating the contact layer 7. At this time, the characteristic temperature $T_0$ in the ordinary temperature region (288 K to 303 K) was 134 K, and the characteristic temperature $T_0$ in the high temperature region (303 K to 353 K) was 575. That is, it has been confirmed that Working Example 1-1 apparently exhibits the high characteristic temperature $T_0$ in the high temperature region compared with those of Reference Example 1-1 and Reference Example 1-2. As illustrated in FIG. 5, it has been confirmed that Working Example 1-1 apparently exhibits the low increase in the threshold current density in association with the temperature rise from the ordinary temperature region compared with those of Reference Example 1-1 and Reference Example 1-2.

Figure 6:
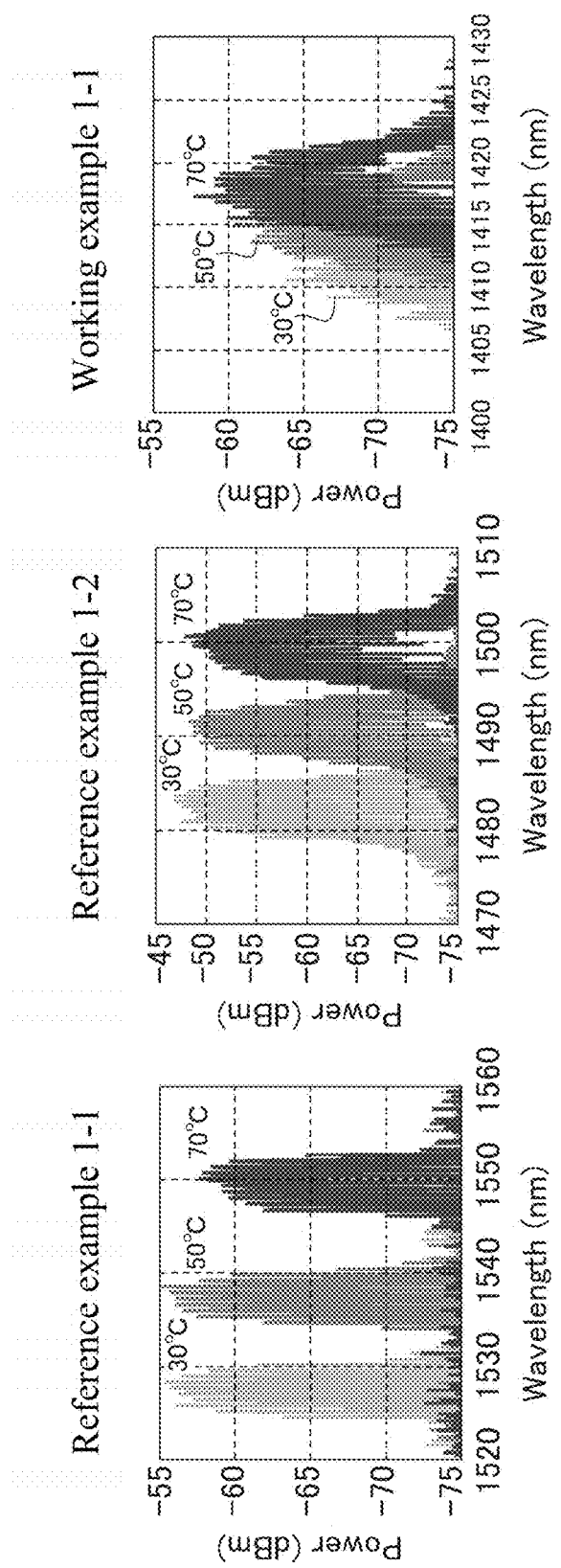
FIG. 6 includes graphs illustrating results of measuring a peak wavelength of a laser emitted from the respective evaluation samples at the set temperatures.

FIG. 6 includes graphs illustrating results of measuring the peak wavelength of the laser emitted from the respective evaluation samples 100 at the set temperatures (30° C., 50° C., 70° C.). The horizontal axis indicates the wavelength (Wavelength (nm)), and the vertical axis indicates the output (Power (dBm)). The peak wavelengths of Table 1 are values read from FIG. 6 and indicate the peak wavelength of the laser emitted from the evaluation samples 100 at 30° C. The amount of peak shift indicates the amount of shift of the peak wavelength in association with the temperature change.

Reference Example 1-1 exhibited the peak wavelength of 1528 nm, and the amount of peak shift of 0.52 nm/° C. Reference Example 1-2 exhibited the peak wavelength of 1483 nm and the amount of peak shift of 0.45 nm/° C.

Working Example 1-1 exhibited the peak wavelength of 1412 nm and the amount of peak shift of 0.11 to 0.15 nm/° C. That is, it has been confirmed that Working Example 1-1 apparently exhibited the small amount of peak shift in association with the temperature change compared with those of Reference Example 1-1 and Reference Example 1-2.

As described above, it has been confirmed that Working Example 1-1 exhibits the large characteristic temperature $T_0$ value in the temperature region compared with those of Reference Example 1-1 and Reference Example 1-2 and therefore the temperature dependence of the threshold current can be evaluated as small. Moreover, it has been confirmed that Working Example 1-1 exhibits the small amount of shift of the peak wavelength in association with the temperature change compared with those of Reference Example 1-1 and Reference Example 1-2 and therefore the temperature dependence of the semiconductor laser can be evaluated as small.

WORKING EXAMPLE 2

Next, the following describes Working Example 2 of the semiconductor optical device 1 according to the embodiment. Working Example 2 created the semiconductor optical device 1 as an evaluation sample for evaluation on properties.

Working Example 2 created 14 evaluation samples (Reference Example 2-1 to Reference Example 2-5 and Working Examples 2-1 to 2-9) whose conditions of the heating temperature and the heating period when the contact layer 7 formed of InGaAs was heated were changed. When the respective evaluation samples were created, Ar was injected into the contact layer 7 by the ion injection method under a condition of the dose amount of $1.0 \times 10^{14}$ $cm^{-2}$.

The evaluation method irradiated a light at around 550 nm to the respective evaluation samples for evaluation on emission intensity. The emission intensity was evaluated by four levels, "Excellent," "Good," "Fair," and "Poor" in the order of higher emission intensity, and the sample not satisfying a specified value was determined as "Poor."

TABLE 2

|  |  | Working Example 2-1 | Working Example 2-2 | Reference Example 2-1 | Reference Example 2-2 | Working Example 2-3 | Working Example 2-4 | Working Example 2-5 | Working Example 2-6 |
|---|---|---|---|---|---|---|---|---|---|
| Creation Condition | Temperature [° C.] | 620 | 600 | 600 | 640 | 600 | 680 | 700 | 720 |
|  | Period [sec] | 30 | 45 | 20 | 20 | 60 | 60 | 60 | 60 |
| Evaluation Result |  | Fair | Good | Poor | Poor | Excellent | Excellent | Good | Fair |

|  |  | Working Example 2-7 | Working Example 2-8 | Working Example 2-9 | Reference Example 2-3 | Reference Example 2-4 | Reference Example 2-5 |
|---|---|---|---|---|---|---|---|
| Creation Condition | Temperature [° C.] | 600 | 680 | 720 | 740 | 600 | 720 |
|  | Period [sec] | 180 | 180 | 180 | 180 | 300 | 300 |
| Evaluation Result |  | Excellent | Excellent | Fair | Poor | Poor | Poor |

Table 2 is a table showing creation conditions and evaluation results of the respective evaluation samples. Reference Example 2-1 and Reference Example 2-2 are evaluation samples formed with the heating period of less than 30 seconds. At this time, Reference Example 2-1 and Reference Example 2-2 exhibited the low emission intensity and did not satisfy the specified value. Moreover, Reference Example 2-4 and Reference Example 2-5 are evaluation samples formed with the heating period in excess of 180 seconds, and Reference Example 2-3 is an evaluation sample formed with the heating temperature in excess of 720° C. At this time, Reference Example 2-3 to Reference Example 2-5 exhibited the low emission intensity and did not satisfy the specified value.

In contrast to this, Working Example 2-1 to Working Example 2-9 are samples formed with the heating temperature of 600° C. or more to 720° C. or less and the heating temperature of 30 seconds or more to 180 seconds or less. At this time, Working Example 2-1 to Working Example 2-9 exhibited the high emission intensity and satisfied the specified value. Especially, Working Example 2-2 to Working Example 2-4, Working Example 2-7, and Working Example 2-8 are samples formed with the heating temperature of 600° C. or more to 680° C. or less and the heating temperature of 45 seconds or more to 180 seconds or less. At this time, Working Example 2-2 to Working Example 2-4, Working Example 2-7, and Working Example 2-8 exhibited the especially high emission intensity.

As described above, it has been confirmed that Working Example 2-1 to Working Example 2-9 can be evaluated as exhibiting the emission intensity satisfying the specified value compared with those of Reference Example 2-1 to Reference Example 2-5. Further, it has been confirmed that Working Example 2-2 to Working Example 2-4, Working Example 2-7, and Working Example 2-8 can be evaluated as exhibiting the especially high emission intensity.

The description of "above" or "below" in the above-described description means the case that the respective configurations are provided separated in the Z-direction, in addition to the case of the respective configurations being in contact.

The method for manufacturing the semiconductor optical device in the above-described embodiments includes the process of forming the active layer on the substrate and the process of forming the clad layer on the active layer. The method for manufacturing the semiconductor optical device includes the process of forming the contact layer containing the first impurity on the clad layer, the process of injecting the second impurity different from the first impurity into the contact layer, and the process of heating the contact layer.

The method for manufacturing the semiconductor optical device in the above-described embodiments, for example, forms InGaAs containing the first impurity as the process of forming the contact layer. The process of heating the contact layer performs the heating at 600° C. or more to 720° C. or less and for 30 seconds or more to 180 seconds or less.

While certain embodiments have been described, these embodiments have been presented by way of example only, and are not intended to limit the scope of the inventions.

What is claimed is:

1. A semiconductor optical device comprising:
an active layer provided on a substrate;
a clad layer provided on the active layer; and
a contact layer provided on the clad layer, the contact layer containing a first impurity and a second impurity different from the first impurity,
wherein:
the first impurity is beryllium or zinc,
the second impurity is argon, phosphorus, or boron, and
the second impurity has a concentration of $1.0 \times 10^{12}$ $cm^{-2}$ or more to $1.0 \times 10^{15}$ $cm^{-2}$ or less.

2. A semiconductor light source comprising:
an active layer provided on a substrate;
a clad layer provided on the active layer; and
a contact layer provided on the clad layer, the contact layer containing a first impurity and a second impurity different from the first impurity,
wherein:
the first impurity is beryllium or zinc,
the second impurity is argon, phosphorus, or boron, and
the second impurity has a concentration of $1.0 \times 10^{12}$ $cm^{-2}$ or more to $1.0 \times 10^{15}$ $cm^{-2}$ or less.

3. An optical integrated circuit comprising
a semiconductor optical device that includes:
an active layer provided on a substrate;
a clad layer provided on the active layer; and
a contact layer provided on the clad layer, the contact layer containing a first impurity and a second impurity different from the first impurity,
wherein:
the first impurity is beryllium or zinc,
the second impurity is argon, phosphorus, or boron, and
the second impurity has a concentration of $1.0 \times 10^{12}$ $cm^{-2}$ or more to $1.0 \times 10^{15}$ $cm^{-2}$ or less.

* * * * *